(12) United States Patent
Lin

(10) Patent No.: US 6,480,413 B2
(45) Date of Patent: Nov. 12, 2002

(54) TWO-DIMENSIONAL RESONANT TUNNELING DIODE MEMORY CELL

(75) Inventor: Hung Chang Lin, Silver Spring, MD (US)

(73) Assignee: Epitaxial Technologies LLC, Baltimore, MD (US)

( * ) Notice: Subject to any disclaimer, the term of this patent is extended or adjusted under 35 U.S.C. 154(b) by 0 days.

(21) Appl. No.: 09/973,466

(22) Filed: Oct. 10, 2001

(65) Prior Publication Data

US 2002/0041511 A1 Apr. 11, 2002

Related U.S. Application Data

(63) Continuation-in-part of application No. 09/512,049, filed on Feb. 24, 2000, now abandoned.

(51) Int. Cl.[7] ................................................ G11C 11/36
(52) U.S. Cl. ........................................ 365/175; 365/105
(58) Field of Search ................................. 365/175, 105, 365/159, 71, 72, 179

(56) References Cited

U.S. PATENT DOCUMENTS

| 5,267,193 A | * | 11/1993 | Lin | 365/168 |
| 5,280,445 A | * | 1/1994 | Shied et al. | 365/175 |
| 5,390,145 A | * | 2/1995 | Nakasha et al. | 365/159 |
| 5,883,829 A | * | 3/1999 | Van der Wagt | 365/159 |
| 5,953,249 A | * | 9/1999 | Van der Wagt | 365/175 |

\* cited by examiner

Primary Examiner—Richard Elms
Assistant Examiner—Anh Phung
(74) Attorney, Agent, or Firm—H. C. Lin

(57) ABSTRACT

Two resonant tunneling diodes with hysteretic folding V-I characteristics are connected in series. The node voltage and the series current of the cell determine the memory state and there can be a large number of states. During writing, one writing pulse sets the pull-down RTD to one of the positive differential resistance region of the hysteretic V-I characteristic, and a second writing pulse sets the pull-up RTD to one of positive differential resistance region. During writing, the series current is sensed by measuring the colon ground current.

8 Claims, 2 Drawing Sheets

US 6,480,413 B2

TWO-DIMENSIONAL RESONANT TUNNELING DIODE MEMORY CELL

This patent application is a continuation-in-part of application Ser. No. 09/512,049, filed Feb. 24, 2000 and now abandoned, and a co-pending application of U.S. Pat. No. 6,285,582B1.

BACKGROUND OF THE INVENTION

(1) Field of the Invention

This invention relates to semiconductor memory—in particular to memory cell using resonant tunneling diodes. (RTD)

(2) Brief Description of the Related Art

In U. S. Pat. No. 5,280,445, a multiple-dimensional RTD memory cell was disclosed, where a single RTD memory cell can store a large number of states, as compared to a conventional binary memory cell, which can only store two states, namely: the "0" logic state and the "1" logic state.

An RTD has a folding voltage-current (V-I) characteristic as shown in FIG. 1, curve (a), where the positive slope of the V-I characteristic represents positive differential resistance and the negative slope of the V-I characteristic represents negative differential resistance. When the positive resistance is connected in series with the RTD, the positive differential resistance is increased and the negative differential resistance is reduced as shown in FIG. 1, curve (b). Further increase in the series resistance causes the V-I characteristic to yield a folding characteristic with hysteresis as shown in FIG. 2.

The multiple-dimensional RTD memory cell disclosed in U.S. Pat. No. 5,280,445 utilizes this hysteretic characteristic. When two RTDs, RTDu and RTDd each with a one-peak hysteretic folding V-I characteristic are connected in series through a resistance R as shown in FIG. 3, the circuit becomes a 4-state memory cell. The cell can have four stable states as depicted in FIG. 4. The stable operating points are the intersections S1, S2, S3, S4 of the positive differential resistance sections of the folding characteristics. By applying two different voltages $V_H$ and $V_L$ across the resistance, the memory cell can be set (written) to the different memory states. In this figure, Vpu,Vvu, and Vpd. Vvd denote voltages at the peak current and valley current of RTDu and RTDd, respectively. During writing, when $V_L$ is less than Vp1, the positive differential resistance ra1 is effective, and when $V_L$ exceeds Vpd, rd2 is effective. Similarly, when $V_H$ is higher than Vpu, ru1 is effective, and when $V_H$ is less than Vpu, rub2 is effective. The stable operating points are determined by the intersections of the effective differential resistances. Thus, by applying different combinations of $V_L$ and $V_H$, the memory cell can be set to different memory states.

The memory cell shown in FIG. 3 as well as that in U.S. Pat. No. 5,280,445 requires a resistor R. The resistor R occupies area in the layout of a memory. In a memory integrated circuit, it is desirable to minimize the memory cell area to increase packing density,

SUMMARY OF THE INVENTION

An object of this invention is to eliminate the resistor in the memory cell in the prior art. Another object of this invention is to sense both the node voltage and the series current of a two dimensional RTD memory cell. Still another object of this invention is to minimize the area of the memory.

These objects are achieved by eliminating the resistor in the memory cell and use only one terminal to access the memory cell. The memory state is determined by the node voltage and the series current of two RTDs with hysteretic V-I characteristics connected in series. During writing, two pulses are applied to the node. One of the pulses selects the effective positive differential resistance characteristic of the pull-down RTD. Another pulse selects the effective positive resistance characteristic of the pull-up RTD. The intersecting point of the two characteristics determines the memory state.

During reading, the node voltage and the series current is sensed. A current sensor is connected in series with the ground terminal of the power supply for the memory cell. The sensor is short-circuited during writing. During reading, the current sensor presents a virtual ground. The current sensor is shared by a large number of memory cells and is connected in series with a bank of memory cells. During reading, only one of the memory cells is connected to the current sensor to sense the current through that particular memory cell.

BRIEF DESDRIPTION OF SEVERAL VIEWS OF THE DRAWINGS

Figure 8A:
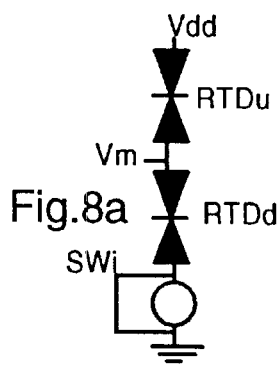
FIG. 8(a) shows the circuit of the memory cell during writing.
Figure 8B:
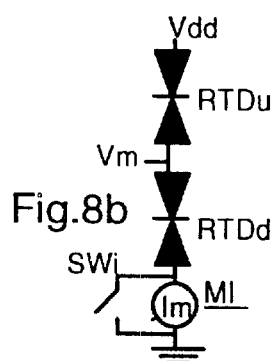

FIG. 8(b), during reading.

Figure 9:
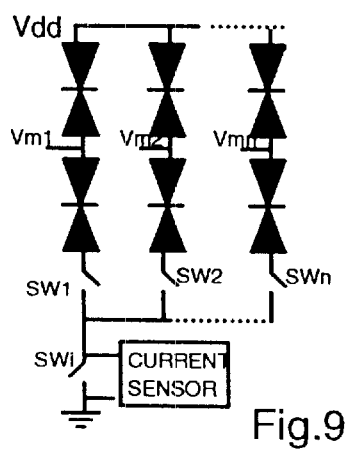

FIG. 9 shows the sharing of current sensor with a bank of memory cells.

Figure 10:
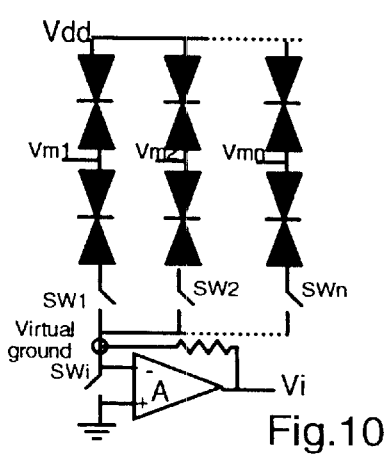

FIG. 10 shows a current sensor using an operational amplifier.

DETAILED DESCRIPTION OF THE INVENTION

Figure 1:
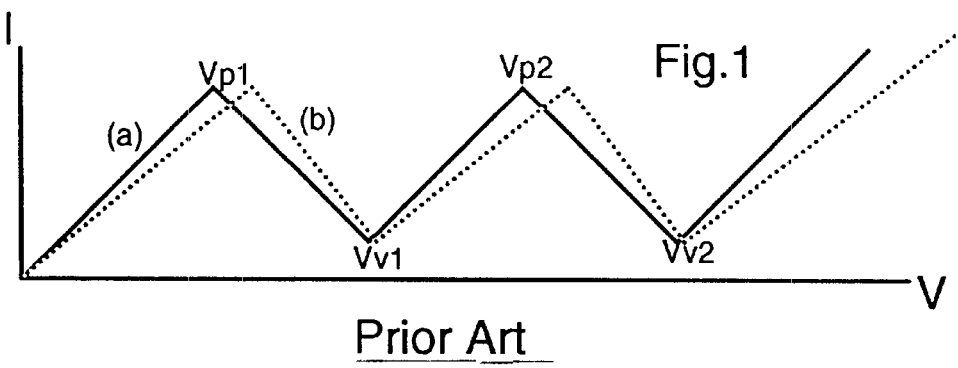
FIG. 1 shows the folding voltage-current characteristic of a resonant tunneling diode.
Figure 2:
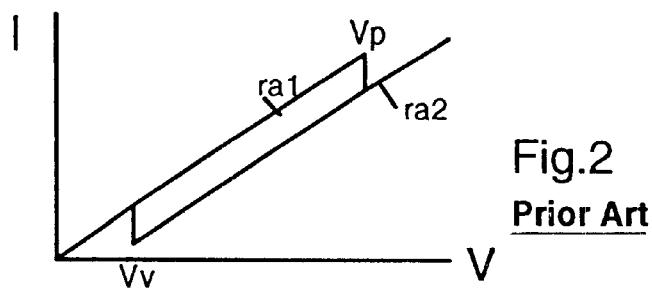
FIG. 2 shows the hysteretic V-I characteristic of a RTD.
Figure 3:
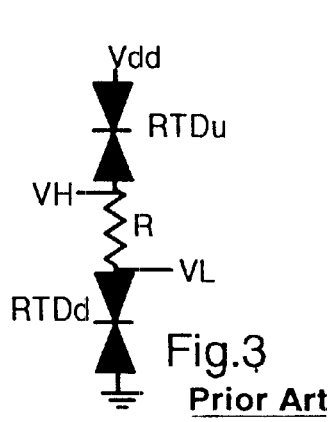
FIG. 3 shows a 2-RTD memory cell with a series resistor.
Figure 4:
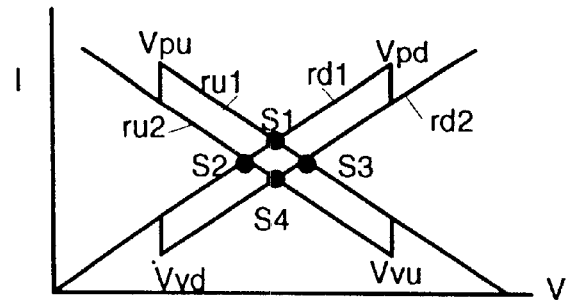
FIG. 4 shows the operation of the memory cell shown in FIG. 3.
Figure 5:
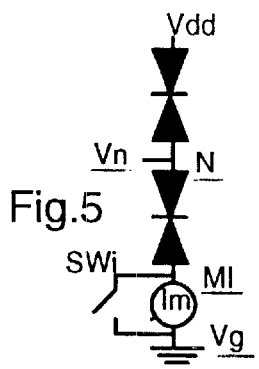
FIG. 5 shows a 2-RTD memory cell without a series resistor based on the present invention.

FIG. 5 shows the memory cell circuit. A pull-up RTDu and a pull-down RTDd are connected in series between a positive power supply Vdd and a ground potential Vg. Between the two RTDu and RTDd is the common node N with a node voltage Vn. A common current sensor is inserted between the RTDd and ground. During writing of the memory cell, the current sensor is short-circuited by a switch SWI as shown in FIG. 8(a).

Figure 6:
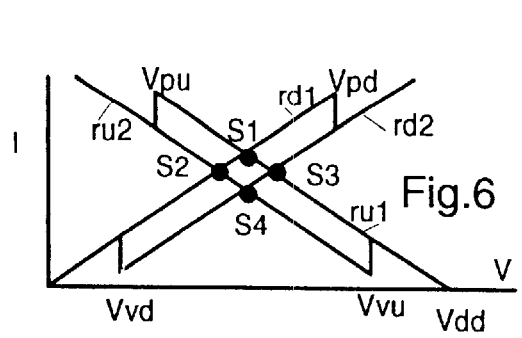
FIG. 6 shows the operation of the present invention for single-peak RTD memory cell.

The writing operation of the memory cell is shown in FIG. 6. The input of the current sensor is short circuited by a switch SWI. For clarity in explanation, two one-peak RTDs with hysteretic folding V-I characteristics are used as pull-up RTDu and pull-down RTDd. The RTDd has a peak voltage Vpd and a valley voltage Vvd. The pull-up RTDu has a peak voltage Vpu and a valley voltage Vvu. The supply voltage is chosen such that Vvu>Vpd and Vpu>Vvd. The RTDd has two possible positive resistance characteristics $r_{d1}$ and $r_{d2}$. The RTDu has two possible positive resistance characteristics $r_{u1}$ and $r_{u2}$. There are four possible memory states where the positive resistance characteristics intersect, namely: S1, where $r_{d1}$ intersects with $r_{u1}$; S2 where $r_{d1}$ with $r_{u2}$; S3 where $r_{d2}$ intersects with $r_{u1}$; and S4 where $r_{d2}$ intersects with $r_{d2}$. Thus the memory state is defined by a matrix of node voltages and series currents.

Figure 7:
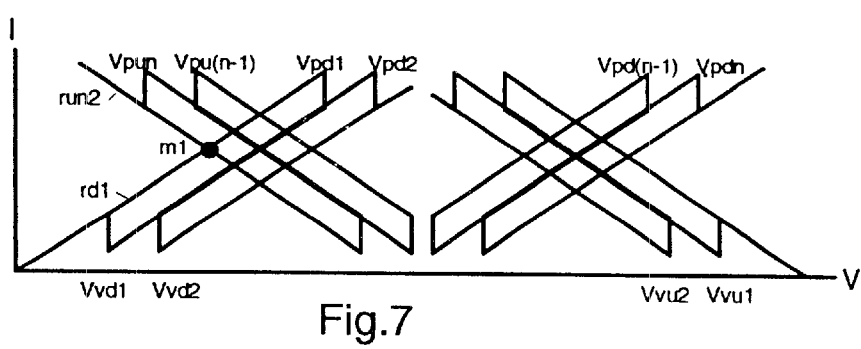
FIG. 7 shows the operation for multiple-peak RTD memory cell.

For a memory cell using RTDs with more than one peak, the same principle applies as illustrated in FIG. 7 for memory cell with two n-peak RTDs. The pull-down RTD has peak voltages Vpd1, Vpd2, . . . Vpdn and valley voltages Vvd1, Vvd2, . . . Vvdn. The pull-up RTD has peak voltages Vpu1, Vpu2, . . . Vpun. If a state is selected, a node voltage Vm satisfying the condition Vpd1>Vm is first applied to the node. RTDd is triggered to the rd1 section of the folding V-I chareacteristic. Then a node voltage Vm satisfying the condition Vpdn>Vm is applied to set the RTDu in the $r_{u2}$ section of the V-I folding characteristic. Then the final memory cell is settled at state Sm with a node voltage Vm and a current Im, so long as Vvd1<Vpun and Vvum>Vpd1. Such a condition can be obtained by adjusting the supply voltage Vdd.

During reading of the memory cell, the switch SWI is opened as shown in FIG. 8(b). The current Im is sensed by the current sensor MI and the node voltage is read as Vm. The two parameters Vm and Im define the memory state of the memory cell. Each RTD memory cell is accessed by coincident sensing of the node voltage Vm, and the series current Im.

The current sensor can be shared by a bank of memory cells as shown in FIG. 9, since only one memory cell is addressed at a time. The individual cells are accessed through switches SW1, SW2, . . . SWn. A convenient current sensor is an operational amplifier as shown in FIG. 10, where the inverting input is at a virtual ground and connected to the ground terminal of the memory cell.

While the current sensor in FIG. 7 is connected in series with the ground, the current sensor can also be connected in series with the positive power supply.

The folding V-I characteristics disclosed in U.S. Pat. No. 5,280,445 were based on RTDs fabricated from compound semiconductor of the GaAs family. This invention is not limited to compound semiconductors. For instance, the Si RTD currently under development is also a promising candidate. Since the RTD is a high speed device, the periphery circuits for writing and reading the RTD memory cell of the present invention should preferably use high frequency transistors for optimum speed. To this end, high speed devices such as the SiGe heterojunction transistors (HBT), modulation-doped field-effect transistors (MODFET), metal-semiconductor field effect transistors (MESFET), etc. are suitable for achieving high speed.

While particular embodiment of the invention has been described, it will be apparent to those skilled in the art that various modifications may be made in the embodiment without departing from the spirit of the present invention. Such modifications are all within the scope of this invention.

What is claimed is:

1. A memory cell using resonant tunneling diodes(RTD), having folding voltage vs current characteristics with multiple current peaks corresponding to different peak voltages, different valley voltages and multiple positive differential resistance regions, comprising:

two said RTDs each having at least one peak voltage and at least one valley voltage connected in series; one as a pull-up RTD and a second one as pull-down RTD;

a node at the common joint between said two RTDs;

an input/output terminal connected to said node for applying a writing voltage to said node and for sensing the node voltage during reading of said memory cell;

a positive supply voltage terminal connected to the unjoint terminal of said pull-up RTD; and a low supply voltage terminal having a ground potential connected to the unjoint terminal of said pull-down RTD for sensing the series current through said two RTDs during reading period of the memory cell, wherein said RTDs have hysteretic characteristics with more than one said series current for the same voltage across each one of said RTDs.

2. The memory cell as described in claim 1, wherein said memory cell can be written to have more than one said node voltage and more than one said series current.

3. The memory cell as described in claim 2, wherein said series current is measured through a virtual ground.

4. The memory cell as described in claim 3, wherein said series current is sensed through a current meter.

5. The memory cell as described in claim 3, wherein said series current is sensed by an operational amplifier which converts the series current to a voltage.

6. The memory cell as described in claim 1, wherein said positive supply voltage is chosen such that:

the first valley voltage of said at least one valley voltage of said pull-down RTD is less than the last peak voltage of said pull-up RTD, and the first valley voltage of said at least one valley voltage of said pull-up RTD is higher than the peak voltage of the last peak voltage of said at least peak voltage of the pull-down RTD.

7. The memory cell as described in claim 6, wherein said memory cell is written by applying two sequential first writing voltage and second writing voltage to said node, said first writing signal setting the pull-down RTD to one of said positive differential resistance characteristic, and said second writing signal setting the pull-up RTD to a second positive differential resistance region.

8. The memory cell as described in claim 7, wherein the first writing voltage sets the pull-down RTD from one said positive differential resistance region to a lower adjacent said positive differential resistance region by increasing the node voltage to exceed the peak voltage of said one said positive differential resistance region, and the second writing voltage sets said pull-up RTD from second said positive differential resistance to a lower adjacent positive differential resistance region by dropping the node voltage to less than the peak voltage of said second positive differential resistance region.

* * * * *